United States Patent
Hamada et al.

(10) Patent No.: US 9,634,799 B2
(45) Date of Patent: Apr. 25, 2017

(54) DECODING DEVICE, INFORMATION TRANSMISSION SYSTEM, AND NON-TRANSITORY COMPUTER READABLE MEDIUM

(71) Applicant: FUJI XEROX CO., LTD., Tokyo (JP)

(72) Inventors: Tsutomu Hamada, Kanagawa (JP); Yoshinori Awata, Kanagawa (JP); Atsushi Ugajin, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 27 days.

(21) Appl. No.: 14/689,850

(22) Filed: Apr. 17, 2015

(65) Prior Publication Data

US 2016/0191205 A1    Jun. 30, 2016

(30) Foreign Application Priority Data

Dec. 26, 2014   (JP) .................................. 2014-265490

(51) Int. Cl.
| | |
|---|---|
| *H03M 13/15* | (2006.01) |
| *H04L 1/00* | (2006.01) |
| *H03M 13/19* | (2006.01) |
| *H03M 5/00* | (2006.01) |

(52) U.S. Cl.
CPC .......... *H04L 1/0045* (2013.01); *H03M 13/19* (2013.01); *H04L 1/0042* (2013.01); *H04L 1/0063* (2013.01); *H03M 5/00* (2013.01)

(58) Field of Classification Search
USPC ......................................... 714/785, 738, 33
See application file for complete search history.

(56) References Cited

U.S. PATENT DOCUMENTS

| | | | | |
|---|---|---|---|---|
| 6,438,434 | B1* | 8/2002 | Kamiya | G10H 1/08 381/119 |
| 7,127,009 | B2* | 10/2006 | Berthet | H03M 13/25 375/341 |
| 2002/0031219 | A1* | 3/2002 | Gutsche | H04L 9/0662 380/28 |
| 2003/0204806 | A1* | 10/2003 | Hisada | H04L 25/4908 714/758 |

(Continued)

FOREIGN PATENT DOCUMENTS

| | | |
|---|---|---|
| JP | H05-284148 A | 10/1993 |
| JP | 2001-102938 A | 4/2001 |

(Continued)

*Primary Examiner* — Fritz Alphonse

(74) *Attorney, Agent, or Firm* — Oliff PLC

(57) ABSTRACT

Provided is a decoding device including a reception unit that receives data of which the number of bits is converted and encoded such that a ratio between appearance frequency of a first code and appearance frequency of a second code is a predetermined range, and to which an error correcting code including redundant bits for calculating an error position of the data and a parity check bit of the data is appended, and a detection unit that detects that there are an odd number of bit errors in the data when a value of a syndrome corresponding to an error position is a first predetermined value and an error occurs in the decoding, or when the value of the syndrome is not the first value and a value of the parity check bit is a second predetermined value and an error occurs in the decoding on the data.

6 Claims, 13 Drawing Sheets

(56) References Cited

U.S. PATENT DOCUMENTS

2005/0229061 A1* 10/2005 Kang ................... G06F 11/263
                                                        714/738
2007/0220342 A1*  9/2007 Vieira ................ G06F 11/3688
                                                        714/33

FOREIGN PATENT DOCUMENTS

| JP | 2009-141453 A | 6/2009 |
| JP | 2013-239940 A | 11/2013 |

* cited by examiner

FIG. 3A

| DATA#0 [15:0] | DATA#1 [15:0] | ... | DATA#i [15:0] | ... | DATA#n-1 [15:0] |

FIG. 3B

| Header [15:0] | DATA#0 [15:0] | DATA#1 [15:0] | ... | DATA#i [15:0] | ... | DATA#n-1 [15:0] |

FIG. 3C

| SOP K28.1/D28.6 | Header [19:0] | DATA#0 [19:0] | DATA#1 [19:0] | ... | DATA#i [19:0] | ... | DATA#n-1 [19:0] |

FIG. 3D

| SOP K28.1/D28.6 | Header [19:0] | DATA#0 [19:0] | DATA#1 [19:0] | ... | DATA#i [19:0] | ... | DATA#n-1 [19:0] | ECC [19:0] |

ERROR CORRECTION CHECKING TARGET

FIG. 3E

| IDLE K28.5/D0.0 | SOP K28.1/D28.6 | Header [19:0] | DATA#0 [19:0] | DATA#1 [19:0] | ... | DATA#i [19:0] | ... | DATA#n-1 [19:0] | ECC [19:0] | IDLE K28.5/D0.0 |

PACKET

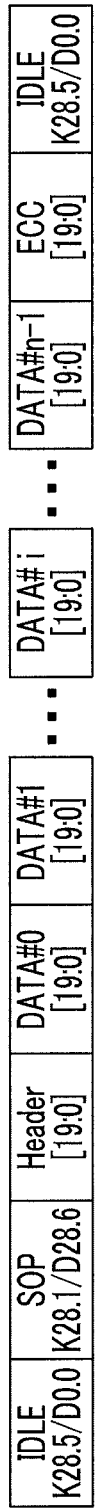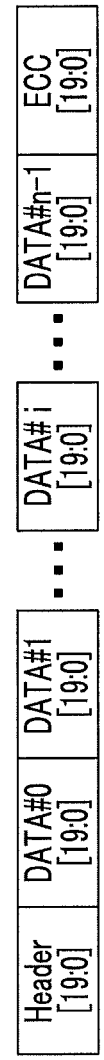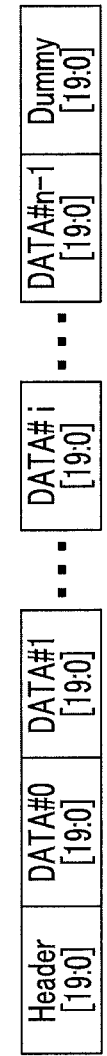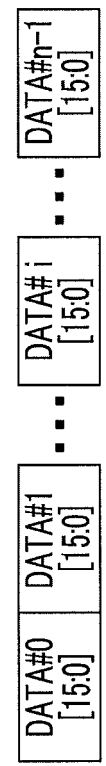

FIG. 7A

| BIT PATTERN | MARK RATIO | RD |
|---|---|---|
| A | 50% | PLUS |
| B | 50% | MINUS |
| C | 40% | PLUS |
| D | 60% | MINUS |
| E | 30% OR LESS OR 70% OR MORE | (OUT-OF-CODE) |

FIG. 7B

| TRANSMISSION | BIT ERROR | TYPE OF DECODING ERROR |
|---|---|---|
| A (5) | C (4) OR D (6) | c OR b |
| B (5) | C (4) OR D (6) | b OR c |
| C (4) | A (5), B (5) OR E (3) | c, b OR a |
| D (6) | A (5), B (5) OR E (7) | b, c OR a |

FIG. 8A

1-BIT ERROR CORRECTION

| Header [19:0] | DATA#0 [19:0] | DATA#1 [19:0] | ... | DATA#i [19:0] ✗ | ... | DATA#n-1 [19:0] | ECC [19:0] |

ERROR CORRECTION

| Header [19:0] | DATA#0 [19:0] | DATA#1 [19:0] | ... | DATA#i [19:0] | ... | DATA#n-1 [19:0] | ECC [19:0] |

FIG. 8B

2-BIT ERROR DETECTION

| Header [19:0] | DATA#0 [19:0] | DATA#1 [19:0] ✗ | ... | DATA#i [19:0] ✗ | ... | DATA#n-1 [19:0] | ECC [19:0] |

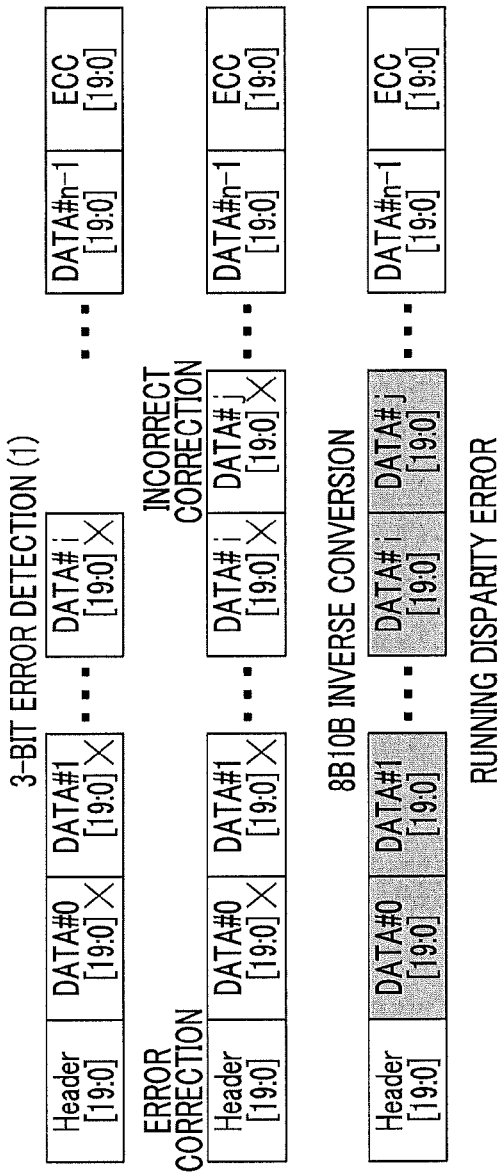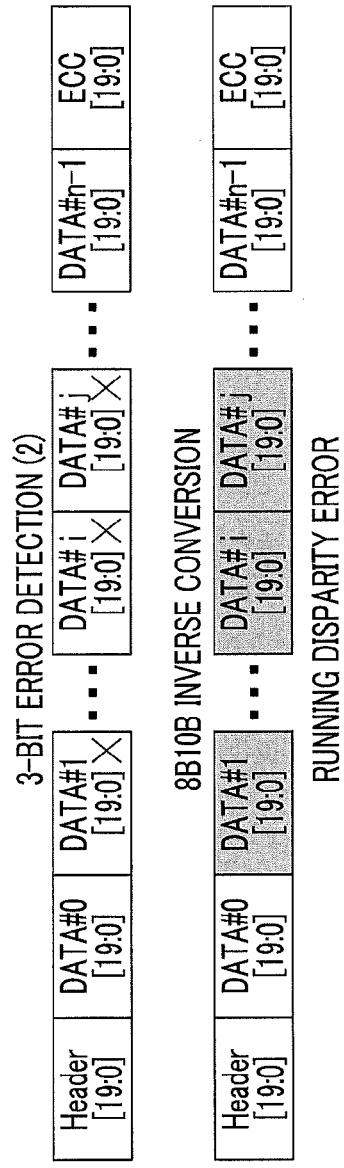

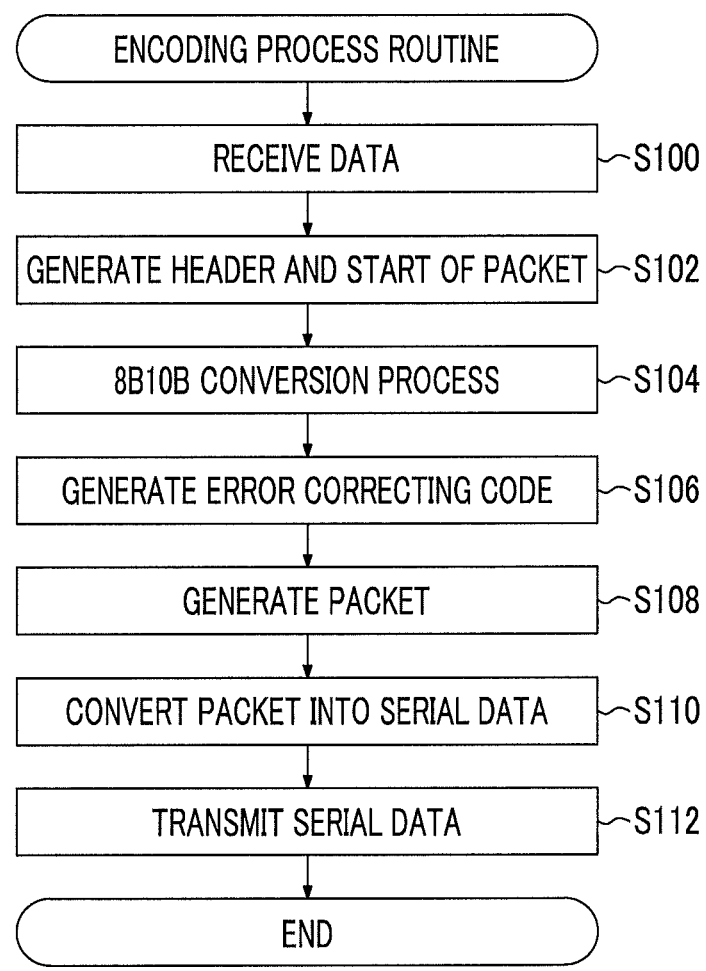

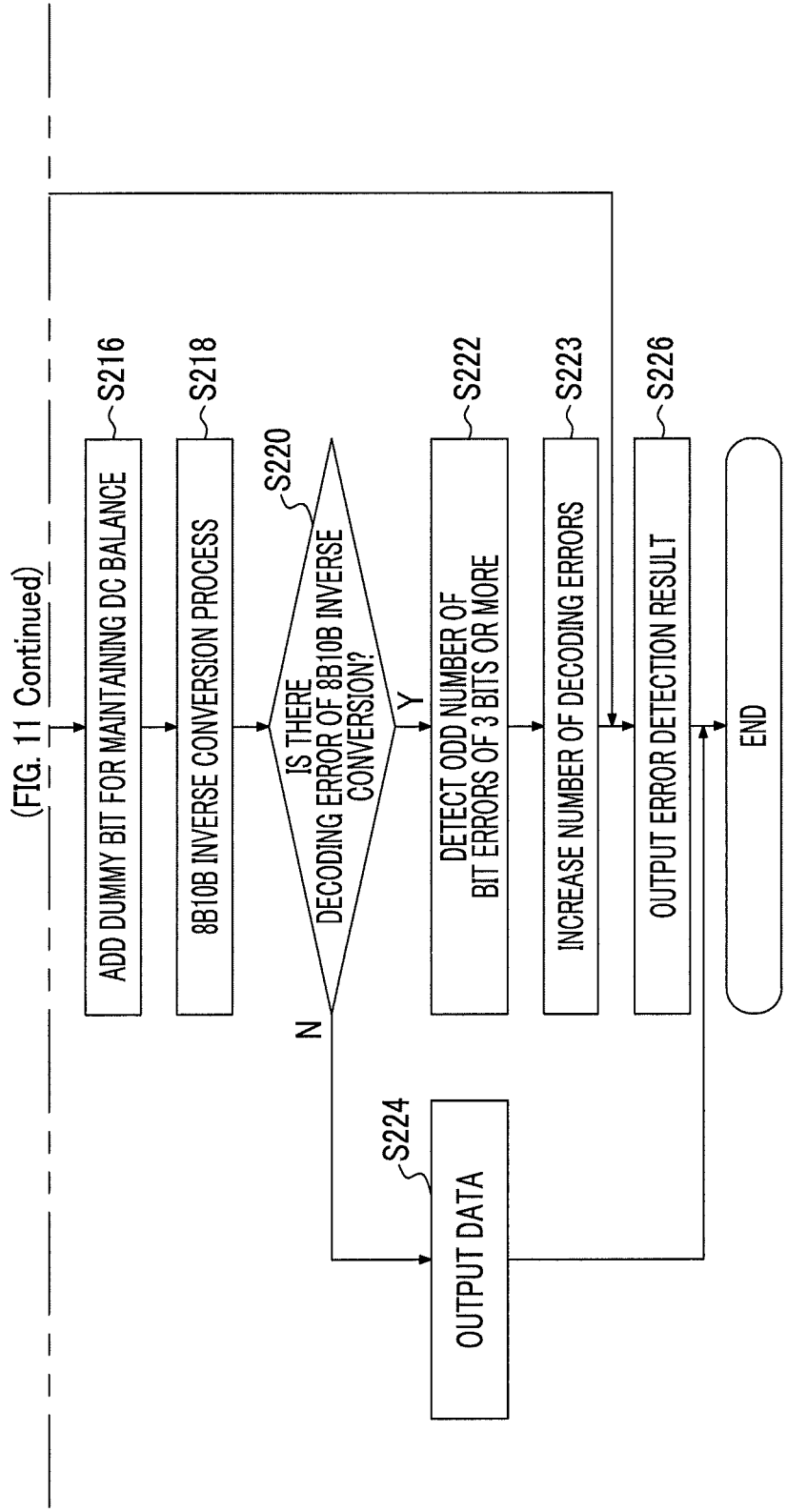

DECODING DEVICE, INFORMATION TRANSMISSION SYSTEM, AND NON-TRANSITORY COMPUTER READABLE MEDIUM

CROSS-REFERENCE TO RELATED APPLICATIONS

This application is based on and claims priority under 35 USC 119 from Japanese Patent Application No. 2014-265490 filed, Dec. 26, 2014.

BACKGROUND

Technical Field

The present invention relates to a decoding device, an information transmission system, and a non-transitory computer readable medium.

SUMMARY

According to an aspect of the invention, there is provided a decoding device including:

a reception unit that receives data of which the number of bits is converted and encoded such that a ratio between appearance frequency of a first code and appearance frequency of a second code is a predetermined range, and to which an error correcting code including redundant bits for calculating an error position of the encoded data and a parity check bit of the encoded data is appended; and a detection unit that detects that there are an odd number of bit errors in the data when a value of a syndrome corresponding to an error position calculated based on the redundant bits included in the error correcting code appended to the encoded data received by the reception unit is a first predetermined value and an error occurs in the decoding on the encoded data, or when the value of the syndrome is not the first value and a value of the parity check bit is a second predetermined value and an error occurs in the decoding on the encoded data.

BRIEF DESCRIPTION OF THE DRAWINGS

Exemplary embodiments of the present invention will be described in detail based on the following figures, wherein:

FIGS. 3A to 3E are diagrams for describing the operation of the encoding device;

FIGS. 6A to 6E are diagrams for describing the operation of the decoding device;

FIGS. 7A and 7B are diagrams for describing the operation of decoding error detection;

FIG. 8A is a diagram for describing the operation of 1-bit error correction, and FIG. 8B is a diagram for describing the operation of 2-bit error detection;

FIGS. 9A and 9B are diagrams for describing the operation of 3-bit error detection;

FIG. 10 is a diagram showing contents of an encoding process routine executed by the encoding device according to the first exemplary embodiment;

DETAILED DESCRIPTION

Hereinafter, exemplary embodiments of the present invention will be described with reference to the drawings. In the following description, a case where the exemplary embodiment of the present invention is applied to an information transmission system that transmits and receives information through serial transmission between two devices will be described.

<Information Transmission System>

Figure 1:
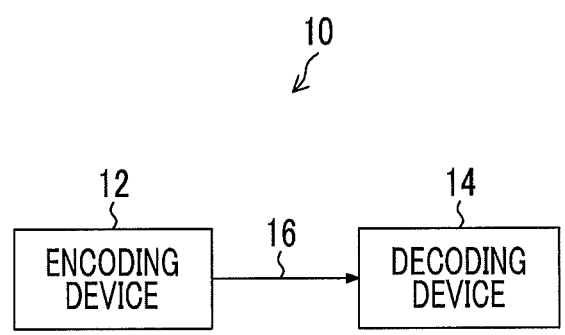
FIG. 1 is a schematic view showing an example of the configuration of an information transmission system according to a first exemplary embodiment of the present invention.

A schematic configuration of an information transmission system according to the exemplary embodiment of the present invention will be described. FIG. 1 is a schematic diagram showing an example of the configuration of the information transmission system according to the exemplary embodiment of the present invention. As shown in FIG. 1, an information transmission system 10 includes an encoding device 12 that transmits information, and a decoding device 14 that receives information.

The encoding device 12 and the decoding device 14 are connected through a transmission line 16. The transmission line 16 is a transmission line for transmitting serialized data from the encoding device 12 to the decoding device 14.

(Encoding Device)

Figure 2:
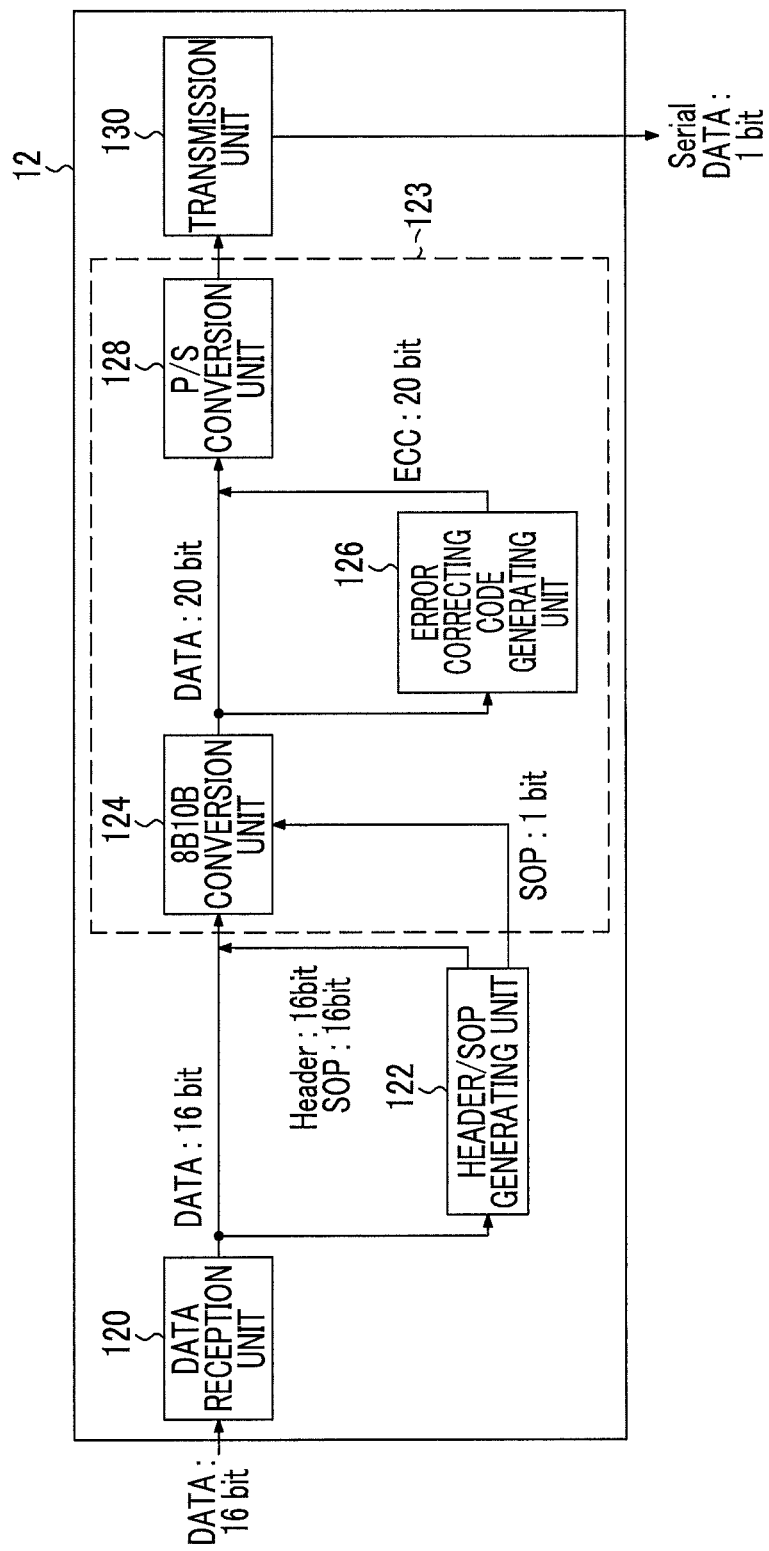
FIG. 2 is a block diagram showing an example of the configuration of an encoding device according to the first exemplary embodiment.

Next, the configuration of the encoding device 12 will be described. FIG. 2 is a block diagram showing an example of the configuration of the encoding device. As shown in FIG. 2, the encoding device 12 includes a data reception unit 120, a header and start-of-packet (SOP) generating unit 122, a conversion unit 123, and a transmission unit 130. The encoding device 12 is mounted by integrated circuits (ICs) such as field programmable gate arrays (FPGAs), application specific integrated circuits (ASICs), or gate arrays. The functional units of the encoding device 12 may be implemented by a computer including a central processing unit (CPU), a random access memory (RAM), and a read only memory (ROM), and the functions of the functional units may be implemented by executing programs stored in the ROM by the CPU.

The data reception unit 120 receives parallel data. In the present exemplary embodiment, an example in which parallel data of 16 bits×n blocks is used will be described. FIG. 3A depicts an example of the parallel data of 16 bits×n blocks. The data reception unit 120 receives the parallel data of 16 bits×n blocks.

The header and start-of-packet (SOP) generating unit 122 obtains the parallel data received by the data reception unit 120, generates a header and a start of packet from the obtained parallel data, and outputs the generated header and start of packet. The header and start-of-packet (SOP) generating unit 122 outputs data (1 bit) indicating the type of the start of packet.

The conversion unit 123 obtains the parallel data received by the data reception unit 120, and the header and the start of packet generated by the header and start-of-packet (SOP) generating unit 122. The conversion unit 123 encodes the data such that direct current (DC) balance is maintained, generates an error correcting code including redundant bits for calculating a syndrome of the encoded data, a parity check bit of the data, and dummy bits for maintaining the DC balance, and adds the generated error correcting code to the 8B10B converted data. The conversion unit 123 includes an 8B10B conversion unit 124, an error correcting code generating unit 126, and a parallel-to-serial (P/S) conversion unit 128.

The 8B10B conversion unit 124 obtains the parallel data received by the data reception unit 120, and the header and the start of packet generated by the header and start-of-packet (SOP) generating unit 122, and adds the header and the start of packet to the obtained parallel data. The 8B10B conversion unit 124 obtains the data (1 bit) indicating the type of the start of packet output from the header and start-of-packet (SOP) generating unit 122, and uses a conversion table of an 8B10B encoding method corresponding to the type of the start of packet. For example, a K28.1 code and a D28.6 code are used as the start of packet.

As shown in FIG. 3C, the 8B10B conversion unit 124 converts the number of bits by encoding the parallel data to which the header and the start of packet are added according to a predetermined encoding method. In the present exemplary embodiment, an example in which the number of bits is converted by the 8B10B encoding method will be described. Specifically, the 8B10B conversion unit 124 converts information of 8 bits into information of 10 bits according to the 8B10B encoding method. In the 8B10B encoding method, information of 8 bits is converted into information of 10 bits using a predetermined conversion table. In the 8B10B encoding method, a converted pattern such as the number of "1"s and the number of "0"s are equally obtained on the converted data is selected. In the present exemplary embodiment, since the data of 16 bits×n blocks is used as a target, data of 16 bits is converted into data of 20 bits, as shown in FIG. 3C.

In the 8B10B encoding method, the 8-bit code is converted into the 10-bit code such that the direct current (DC) balance is maintained. The DC balance refers to a ratio between the number of "1"s and the number of "0"s. The DC balance being maintained means that a ratio between the appearance frequency of "1" and the appearance frequency of "0" becomes a predetermined range, and for example, means that the ratio is uniform. In the present exemplary embodiment, "0" is used as a first code, and "1" is used as a second code. For example, when the data is viewed in a transmission direction, the data of which DC balance is maintained is generated by arranging bits such that "1"s and "0"s are not continued in a predetermined number or more.

With regard to a running disparity, when a running disparity of the last code is a plus in the data encoded by the 8B10B encoding method, a code having a minus running disparity is subsequently sent. In contrast, when the running disparity thereof is a minus, a code having a plus running disparity is subsequently sent. Such a configuration is an example in which the number of "1"s and the number of "0"s are equally obtained. However, when the number of "1"s and the number of "0"s are the same, polarities of the running disparity are continued.

In the 8B10B encoding method, a code of 10 bits corresponding to 8-bit input data is individually defined as two states of the running disparity, that is, "plus" and "minus".

The code of which a current running disparity is a minus is a code of which the number of "1"s is equal to the number of "0"s (having a neutral disparity) or of which the number of "1"s is greater than the number of "0"s (having a plus disparity). Meanwhile, the code of which a current running disparity is a plus is a code which has a neutral disparity or of which the number of "1"s is less than the number of "0"s (having a minus disparity).

For example, when the code of which a current running disparity is a minus and having the plus disparity is output, the next running disparity becomes a plus, and thus, the plus disparity is not generated in at least the next output bit array. When the code having the neutral disparity is output, the next running disparity is maintained as a minus.

When the code of which a current running disparity is a plus and having the minus disparity is output, the next running disparity becomes a minus, and thus, the minus disparity is not generated in at least the next output bit array. When the code having the neutral disparity is output, the next running disparity is maintained as a plus.

As mentioned above, in the 8B10B encoding method, by using an encoding rule that selects whether an output bit is correlated to a minus disparity or a plus disparity depending on the value of the last RD, the output bit array is controlled such that the number of "0"s and the number of "1"s are equal to each other or approximately equal to each other.

The error correcting code generating unit 126 generates an error correcting code (ECC) from the parallel data converted by the 8B10B conversion unit 124. The error correcting code used in the present exemplary embodiment includes redundant bits for calculating a syndrome corresponding to an error position of the data, a parity check bit, and dummy bits for maintaining DC balance in a neutral state. In the present exemplary embodiment, the error correcting code obtained by an extended Hamming code is used. One bit error is corrected, and an even-bit error is detected by using the parity check bit obtained by the extended Hamming code.

Figure 4A:
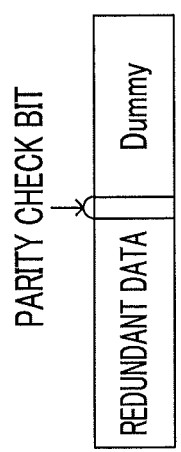
FIG. 4A is a diagram showing an example of an error correcting code.

FIG. 4A shows an example of the error correcting code. As shown in FIG. 4A, in the present exemplary embodiment, an error correcting code of 20 bits in total in which dummy bits for maintaining DC balance are added to 11 bits obtained by combining a 10 redundant bits for calculating syndromes ($S_0$) to ($S_9$) and a parity check bit PO is generated.

As shown in FIG. 3D, the conversion unit 123 adds the error correcting code of 20 bits generated by the error correcting code generating unit 126 to the parallel data of 20 bits converted by the 8B10B conversion unit 124. The parallel-to-serial (P/S) conversion unit 128 converts the parallel data to which the error correcting code has been added into a serial bit array. In the present exemplary embodiment, the header of 20 bits and the error correcting code of 20 bits are added to data of 20×n bits, parallel-to-serial conversion on the data of 20×(n+2) bits are performed, and the converted data is transmitted as a packet by the transmission unit 130 to be described below.

Figure 4B:
FIG. 4B is a diagram showing an example of data to be transmitted.

The transmission unit 130 outputs the serial data converted by the parallel-to-serial (P/S) conversion unit 128 to the transmission line 16. An example of the data output by the transmission unit 130 is shown in FIG. 3D. As shown in FIG. 4B, when the packet is not transmitted, the transmission unit 130 transmits IDLE codes. The IDLE codes are inserted into the sections both of before and after the packet. For example, a K28.5 code and a D0.0 code are used as the IDLE code.

(Decoding Device)

Figure 5:
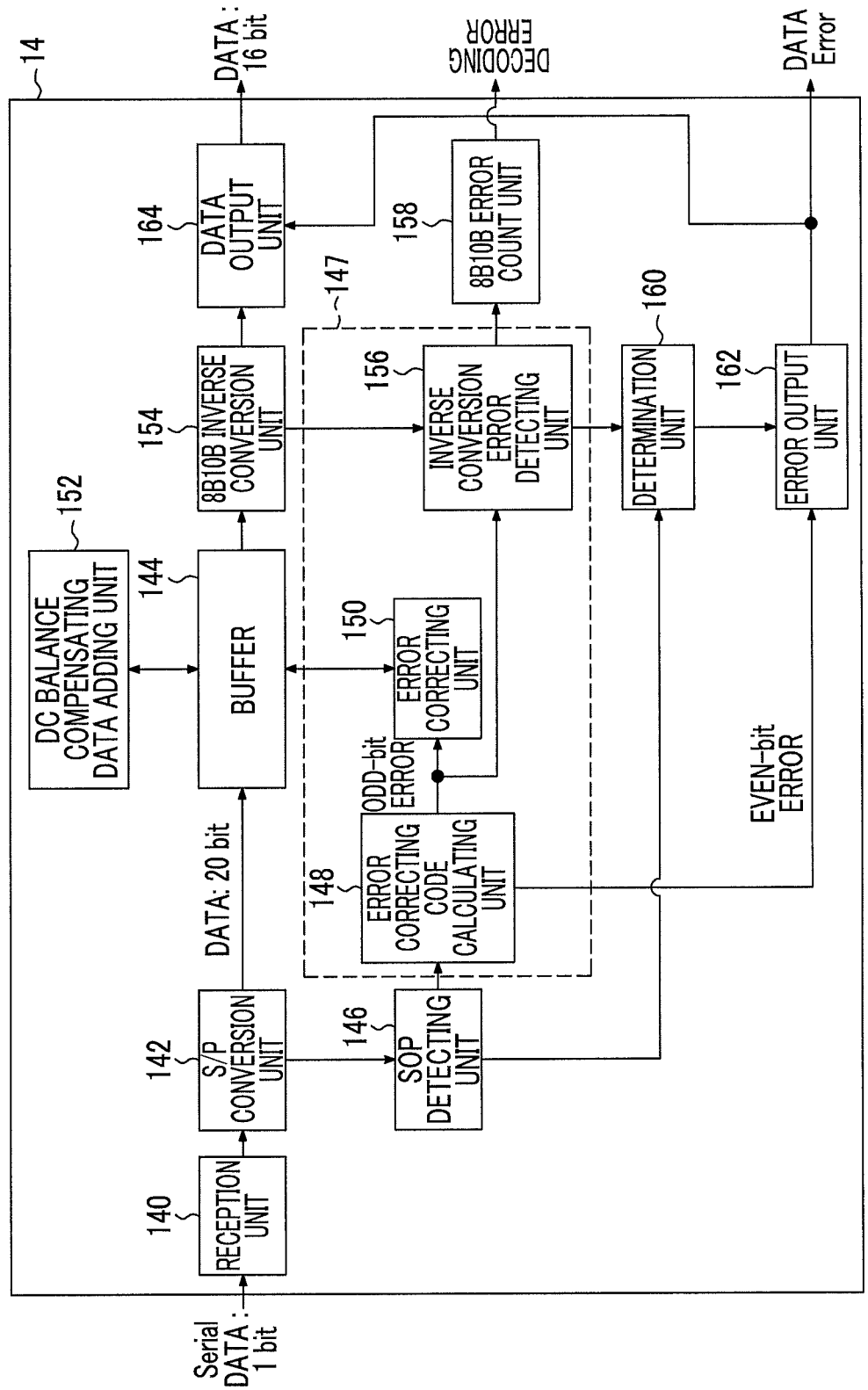
FIG. 5 is a block diagram showing an example of the configuration of a decoding device according to the first exemplary embodiment.

Next, the configuration of the decoding device 14 will be described. FIG. 5 is a block diagram showing an example of the configuration of the decoding device. As shown in FIG. 5, the decoding device 14 includes a reception unit 140, a serial-to-parallel (S/P) conversion unit 142, a buffer 144, a SOP detecting unit 146, a detection unit 147, a DC balance compensating data adding unit 152, an 8B10B inverse conversion unit 154, an 8B10B error count unit 158, a determination unit 160, an error output unit 162, and a data output unit 164. The decoding device 14 is mounted by integrated circuits (ICs) such as field programmable gate arrays (FPGAs), application specific integrated circuits (ASICs), or gate arrays. The functional units of the decoding device 14 may be implemented by a computer including a central processing unit (CPU), a random access memory (RAM), and a read only memory (ROM), and the functions of the functional units may be executed by executing programs stored in the ROM by the CPU.

The reception unit 140 receives the serial data transmitted from the encoding device 12 through the transmission line 16. The serial data received by the reception unit 140 is data encoded such that the DC balance is maintained, and is data to which the error correcting code is appended. The error correcting code includes redundant bits for calculating an error position of the data, a parity check bit of the data, and dummy data for maintaining the DC balance. FIG. 6A shows an example of the serial data received by the reception unit 140.

The serial-to-parallel (S/P) conversion unit 142 converts the serial data received by the reception unit 140 into parallel data. The serial-to-parallel (S/P) conversion unit 142 stores the converted parallel data in the buffer 144.

The parallel data converted by the serial-to-parallel (S/P) conversion unit 142 is stored in the buffer 144.

The SOP detecting unit 146 detects a start of packet (SOP) from the parallel data converted by the serial-to-parallel (S/P) conversion unit 142, and outputs data obtained by removing the start of packet (SOP) from the parallel data.

The detection unit 147 calculates a syndrome corresponding to the error position from the redundant bits included in the error correcting code appended to the parallel data output from the SOP detecting unit 146.

When the value of the syndrome is not "0" and the value of the parity check bit is "0", the detection unit 147 detects that there are an even number of bit errors in the data. In the present exemplary embodiment, "0" is used as a first predetermined value, and "1" is used as a second predetermined value.

When the value of the syndrome is not "0" and the value of the parity check bit is "1", and also when an error occurs during the 8B10B decoding on the data in which the bit error correction in accordance with the value of the syndrome has been performed by an error correcting unit 150 to be described below, the detection unit 147 detects that there are an odd number of bit errors of 3 bits or more in the data.

The detection unit 147 includes an error correcting code calculating unit 148, the error correcting unit 150, and an inverse conversion error detecting unit 156.

The error correcting code calculating unit 148 detects a bit error of the parallel data by using the error correcting code included in the parallel data output from the SOP detecting unit 146 shown in FIG. 6B. Specifically, the error correcting code calculating unit 148 calculates a syndrome corresponding to the error position from the redundant bits of the error correcting code included in the parallel data. The error correcting code calculating unit 148 detects one bit error or an even number of bit errors based on a combination of the calculated syndrome and the parity check bit included in the error correcting code.

More specifically, when the calculated syndrome is not "0" and the parity check bit included in the error correcting code is "0", the error correcting code calculating unit 148 detects an even number of bit errors of the parallel data, and outputs the detection result to the error output unit 162. When the calculated syndrome is not "0" and the parity check bit included in the error correcting code is "1", the error correcting code calculating unit 148 detects an odd number of bit errors of the parallel data, and outputs the detection result to the error correcting unit 150 and the inverse conversion error detecting unit 156.

Even when the value of the syndrome calculated by the error correcting code calculating unit 148 is "0", there are three bit errors. Thus, in the present exemplary embodiment, three bit errors are detected by checking a decoding error occurring by the 8B10B inverse conversion unit 154 to be described below.

The syndrome corresponding to the error position is expressed using an error pattern e as represented in the following expression.

$$S_m = e_i \oplus e_j \oplus e_k \ (i \neq j \neq k) \quad \text{[Expression 1]}$$

Where, i, j, k, and m represent positions of bit errors. As represented in this expression, when i, j, and k are different from each other in the expression, a syndrome when three bit errors occur is a position m different from i, j and k, and erroneous error correction is performed by the error correcting unit 150 to be described below.

For example, if an error pattern $e_i$="010000" (a 16th bit is an error bit), $e_j$="100000" (a 32nd bit is an error bit), and $e_k$="110000" (a 48th bit is an error bit), when the syndrome is calculated based on the expression, a syndrome $S_m$="000000". Thus, it is determined that there is no bit error despite the fact that there is a bit error. In the present exemplary embodiment, three bit errors are detected by checking the 8B10B decoding error occurring by the 8B10B inverse conversion unit 154 to be described below.

When the parity check bit is "1" based on the detection result output from the error correcting code calculating unit 148, that is, when there are an odd number of bit errors, the error correcting unit 150 performs 1-bit error correction on data stored in the buffer 144. Specifically, the error correcting unit 150 obtains the position of the error bit from the syndrome calculated by the error correcting code calculating unit 148, and corrects a bit error corresponding to the position.

As shown in FIG. 6C, the DC balance compensating data adding unit 152 adds the dummy bits of which the DC balance is maintained instead of the error correcting code included in the parallel data stored in the buffer 144. The dummy bits are bits for compensating for the DC balance, and, for example, data of 20 bits having a mark ratio of 0.5 is added in the present exemplary embodiment.

The 8B10B inverse conversion unit 154 decodes the parallel data stored in the buffer 144 using a predetermined conversion table according to the 8B10B encoding method, and outputs the decoded data. Thus, as shown in FIG. 6D, the data of 20 bits is converted into the original data of 16 bits. The 8B10B inverse conversion unit 154 outputs the decoded data of 16 bits to the data output unit 164. An example of the data output from the 8B10B inverse conversion unit 154 is shown in FIG. 6E.

When an 8B10B decoding error occurs, the 8B10B inverse conversion unit 154 outputs information indicating that the decoding error occurs to the inverse conversion error detecting unit 156. When the value of the syndrome calculated by the error correcting code calculating unit 148 is not "0" and the value of the parity check bit is "1", and also when the error occurs in the 8B10B decoding on the data on which the error correction is performed by the error correcting unit 150, the 8B10B inverse conversion unit 154 detects that there are an odd number of bit errors of 3 bits or more in the data by using the predetermined conversion table and the running disparity.

The 8B10B decoding error includes an out-of-code error in which decoding target data to be decoded by the 8B10B inverse conversion unit 154 is not present in the predetermined conversion table, and a running disparity error indicating that a running disparity of the decoding target data to be decoded by the 8B10B inverse conversion unit 154 is against the rules.

When the bit error is 1 bit, since the error bit is correctly corrected by the error correcting unit 150, the 8B10B decoding error due to the decoding process of the 8B10B inverse conversion unit 154 does not occur. Meanwhile, when the bit errors are odd bits of 3 bits or more, since the bit to be corrected by the error correcting unit 150 is incorrect, the 8B10B decoding error (including running disparity error) occurs by the 8B10B inverse conversion unit 154.

FIGS. 7A and 7B are diagrams for describing the 8B10B decoding error occurring by the decoding process of the 8B10B inverse conversion unit 154. FIG. 7A shows the running disparities (RD) of the data output up to the present time from the 8B10B conversion unit 124 of the encoding device 12, a bit pattern of data to be output next, and a mark ratio of the bit pattern. FIG. 7B shows the bit pattern of the data transmitted from the encoding device 12, the bit error occurring in the bit pattern, and the decoding error occurring by the decoding process due to the 8B10B inverse conversion unit 154 of the decoding device 14. The value between parentheses shown in FIG. 7B represents the number of "1"s when the data is, for example, 10 bits. "a" represents the out-of-code error, "b" represents the running disparity error, and "c" represents the running disparity error occurring in the subsequent data.

As shown in FIG. 7A, when the running disparity is, for example, a "plus", the bit array output according to the 8B10B encoding method is output as data corresponding to the bit pattern A or C. Meanwhile, when the running disparity is a "minus", the bit array output according to the 8B10B encoding method is output as data corresponding to the bit pattern B or D. The bit pattern E of FIG. 7A is data having a mark ratio of 30% or less or 70% or more, and represents that there is no conversion table of the 8B10B encoding method.

When the bit patterns shown in FIG. 7A are transmitted from the encoding device 12 to the decoding device 14, it is assumed that one bit error occurs as shown in FIG. 7B. For example, a bit pattern A(5) is transmitted by the encoding device 12, one bit error occurs in the bit pattern A(5), and the decoding device 14 receives the bit pattern D(6). The 8B10B inverse conversion unit 154 of the decoding device 14 determines that the running disparity error occurs from the mark ratio of the bit pattern D(6) and the current running disparity. When the data having a mark ratio of 60% (plus) is received despite the fact that the current running disparity is a plus, it is determined that the running disparity error occurs.

For example, the bit pattern A(5) is transmitted by the encoding device 12, one bit error occurs in the bit pattern A(5), and the decoding device 14 receives the bit pattern C(4). In this case, when the subsequent data transmitted from the encoding device 12 is received, the running disparity is against the rules. The 8B10B inverse conversion unit 154 of the decoding device 14 determines that the running disparity error occurs.

For example, the bit pattern C(4) is transmitted by the encoding device 12, one bit error occurs in the bit pattern C(4), and the decoding device 14 receives the bit pattern E(3). In this case, since the bit pattern E(3) of FIG. 7A is not present in the conversion table, the inverse conversion error detecting unit 156 of the decoding device 14 detects the out-of-code error.

Here, the type of bit errors will be described. FIGS. 8A, 8B, 9A and 9B show examples of the bit error.

As shown in FIG. 8A, when one bit error occurs in an i-th block within the data, since the value of the syndrome calculated by the error correcting code calculating unit 148 is not "0" and the parity check bit is "1", the error position is detected depending on the value of the syndrome, and one bit error is corrected by the error correcting unit 150.

As shown in FIG. 8B, when two bit errors including one bit error occurring in the #1-st block within the data and one bit error occurring in the #i-th block occur in total, since the value of the syndrome calculated by the error correcting code calculating unit 148 is not "0" and the parity check bit is "0", two bit errors are detected.

As shown in FIG. 9A, when three bit errors including one bit error occurring in a #0-th block within the data, one bit error occurring in the #1-st block and one bit error occurring in the #i-th block occur in total, and also when the value of the syndrome calculated by the error correcting code calculating unit 148 is not "0" and the parity check bit is "1", the error correction in accordance with the value of the syndrome is performed by the error correcting unit 150. However, when the three bit errors occur, when the error correction in accordance with the value of the syndrome calculated by the error correcting code calculating unit 148 is performed, the bit corresponding to a position different from the error position of an actual bit is incorrectly corrected. When the decoding process is performed by the 8B10B inverse conversion unit 154, if there is one bit error for every 10 bits as shown in FIG. 9A, the running disparity error is detected.

As shown in FIG. 9B, when three bit errors including one bit error occurring in the #1-st block within the data, one bit error occurring in the #i-th block, and one bit error occurring in the #j-th block occur in total, and also when the value of the syndrome calculated by the error correcting code calculating unit 148 is "0" and the parity check bit is "1", if there is one bit error for every 10 bits, the running disparity error is detected by the decoding process of the 8B10B inverse conversion unit 154.

When an even number of bit errors of 4 bits or more occur, and also when the value of the syndrome calculated by the error correcting code calculating unit 148 is not "0" and the parity check bit is "0", an even number of bit errors are detected.

When an even number of bit errors of 4 bits or more occur, and when the value of the syndrome calculated by the error correcting code calculating unit 148 is "0" and the parity check bit is "0", if there is one bit error for every 10 bits, the running disparity error is detected by the decoding process of the 8B10B inverse conversion unit 154.

When an odd number of bit errors of 5 bits or more occur, and also when the value of the syndrome calculated by the error correcting code calculating unit 148 is not "0" and the parity check bit is "1", if erroneous correction is performed by the error correcting unit 150 and there is one bit error for every 10 bits, the running disparity error is detected by the decoding process of the 8B10B inverse conversion unit 154.

When an odd number of bit errors of 5 bits or more occur, and also when the value of the syndrome calculated by the error correcting code calculating unit 148 is "0" and the parity check bit is "1", if there is one bit error for every 10 bits, the running disparity error is detected by the decoding process of the 8B10B inverse conversion unit 154.

When the 8B10B decoding error is output from the 8B10B inverse conversion unit 154, the inverse conversion error detecting unit 156 detects that three or more bit errors occur within a range of the packet. The inverse conversion error detecting unit 156 outputs information indicating that three or more bit errors occur to the 8B10B error count unit 158 and the determination unit 160.

The 8B10B error count unit 158 counts the number of decoding errors detected by the inverse conversion error detecting unit 156. The 8B10B error count unit 158 outputs the number of decoding errors. When the number of decoding errors is equal to or greater than a predetermined threshold, the information transmission system 10 stops transmitting and receiving data.

When the start of packet is detected by the SOP detecting unit 146, the determination unit 160 outputs the detection result detected by the inverse conversion error detecting unit 156 to the error output unit 162.

The error output unit 162 outputs the detection result of odd number of bit errors of 3 bits or more output from the determination unit 160 and the detection result of an even number of bit errors output from the error correcting code calculating unit 148, as a result.

When there is no bit error, the data output unit 164 outputs the data of 16 bits output from the 8B10B inverse conversion unit 154 based on the detection results output from the error output unit 162.

<Operation of Information Transmission System>

Next, the operation of the information transmission system 10 will be described. As described above, the operation of the information transmission system 10 is executed in the encoding device 12 and the decoding device 14.

<Process Performed by Encoding Device>

A process executed by the encoding device 12 will be first described.

FIG. 10 is a flowchart showing an example of a procedure of an encoding process routine executed by the encoding device 12. When the parallel data to be encoded is input, the encoding device 12 executes the encoding process routine shown in FIG. 10.

In step S100, the parallel data is received by the data reception unit 120.

In step S102, the header and the start of packet are generated from the parallel data received in step S100 by the header and start-of-packet (SOP) generating unit 122.

In step S104, the header and the start of packet generated in step S102 are added to the parallel data received in step S100 by the 8B10B conversion unit 124. The bit number of the parallel data to which the header and the start of packet are added is converted by the 8B10B conversion unit 124 according to the 8B10B encoding method.

In step S106, the error correcting code is generated from the parallel data of which the bit number is converted in step S104 by the error correcting code generating unit 126.

In step S108, a packet is generated by adding the error correcting code generated in step S106 to the parallel data of which the bit number is converted in step S104.

In step S110, the packet generated in step S108 is converted into the serial data by the parallel-to-serial (P/S) conversion unit 128.

In step S112, the serial data converted in step S110 is output to the transmission line 16 by the transmission unit 130, and the encoding process routine is ended.

<Process Performed by Decoding Device>

Next, the process executed by the decoding device 14 will be described.

Figure 11:
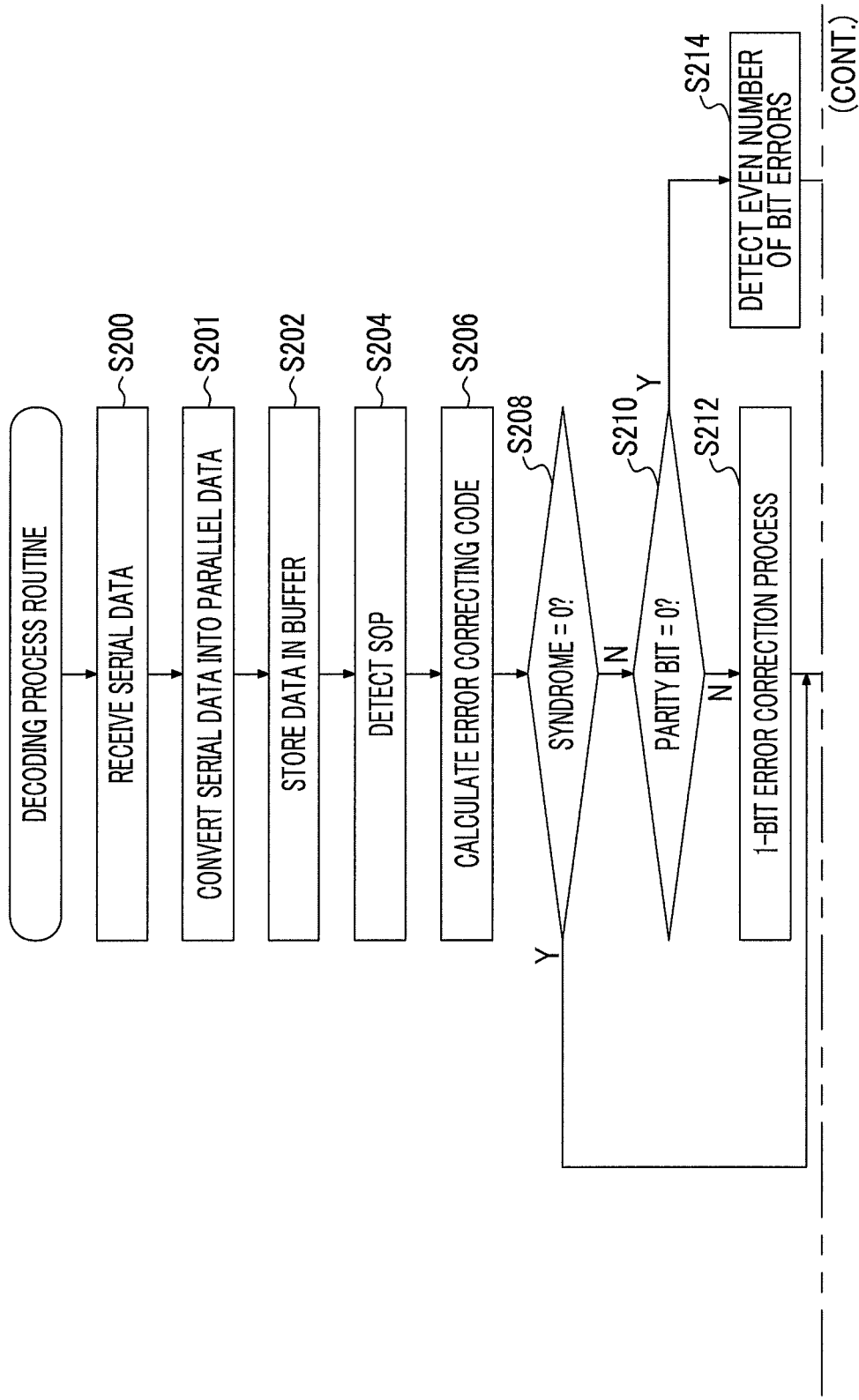
FIG. 11 is a diagram showing contents of a decoding process routine executed by the decoding device according to the first exemplary embodiment.

FIG. 11 is a flowchart showing an example of a procedure of a decoding process routine executed by the decoding device 14. When data to be decoded is received, the decoding device 14 executes the decoding process routine shown in FIG. 11.

In step S200, the serial data transmitted by the encoding device 12 through the transmission line 16 is received by the reception unit 140.

In step S201, the serial data received in step S200 is converted into the parallel data by the serial-to-parallel (S/P) conversion unit 142.

In step S202, the parallel data converted in step S201 is stored in the buffer 144 by the serial-to-parallel (S/P) conversion unit 142.

In step S204, the start of packet (SOP) is detected from the parallel data converted in step S201 by the SOP detecting unit 146, and the parallel data obtained by removing the start of packet (SOP) from the parallel data is output.

In step S206, the syndrome is calculated from the redundant bits of the error correcting code included in the parallel data converted in step S201 by the error correcting code calculating unit 148.

In step S208, it is determined by the error correcting code calculating unit 148 whether or not the syndrome calculated in step S206 is "0". When the syndrome is "0", the process proceeds to step S216. Meanwhile, when the syndrome is not "0", the process proceeds to step S210.

In step S210, it is determined by the error correcting code calculating unit 148 whether or not the parity check bit of the error correcting code included in the parallel data converted in step S201 is "0". When the parity check bit is "0", the process proceeds to step S214. Meanwhile, when the parity check bit is not "0", the process proceeds to step S212.

In step S212, the 1-bit error correction is performed on the data stored in the buffer 144 in step S202 by the error correcting unit 150.

In step S214, an even number of bit errors are detected by the error correcting code calculating unit 148.

In step S216, the dummy bit of which the DC balance is maintained instead of the error correcting code included in the parallel data stored in the buffer 144 is added by the DC balance compensating data adding unit 152.

In step S218, the parallel data stored in the buffer 144 is decoded according to the 8B10B encoding method by the 8B10B inverse conversion unit 154, and the decoded data is output.

In step S220, it is determined by the 8B10B inverse conversion unit 154 whether or not the decoding error occurs by the decoding in step S218 by using the predetermined conversion table and the value of the running disparity. When the 8B10B decoding error occurs, the process proceeds to step S222. Meanwhile, when the 8B10B decoding error does not occur, the process proceeds to step S224.

In step S222, it is detected by the inverse conversion error detecting unit 156 that there are an odd number of bit errors of 3 bits or more in the data.

In step S223, the 8B10B error count unit 158 increases the count of decoding errors by one.

In step S224, the parallel data stored in the buffer 144 is output, and the decoding process routine is ended.

In step S226, an even number of bit errors detected in step S214 or an odd number of bit errors of 3 bits or more detected in step S222 are output as results, and the decoding process routine is ended.

Second Exemplary Embodiment

Although it has been described in the first exemplary embodiment that when the decoding device 14 includes the error correcting unit 150 and the error correcting unit 150 performs the 1-bit error correction on the data stored in the buffer 144 when there are an odd number of bit errors in the data. In contrast, it will be described in the second exemplary embodiment that even when there are an odd number of bit errors in the data, the 1-bit error correction is not performed. The same configurations as those of the decoding device 14 of the first exemplary embodiment will be assigned the same reference numerals as those of the first exemplary embodiment, and the description thereof will be omitted.

Figure 12:
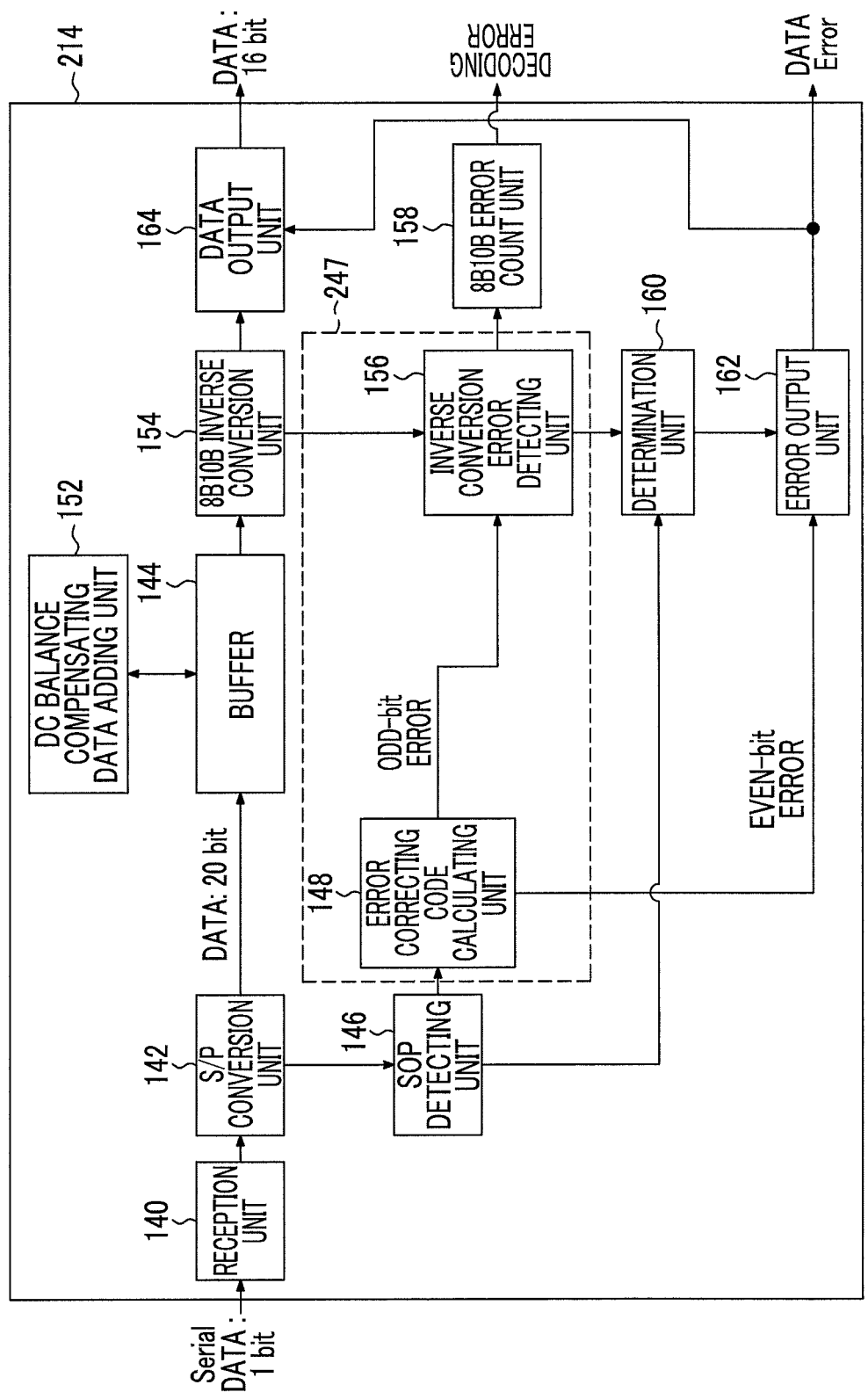
FIG. 12 is a block diagram showing an example of the configuration of a decoding device according to a second exemplary embodiment.

FIG. 12 is a block diagram showing an example of the configuration of a decoding device 214 according to the second exemplary embodiment. As shown in FIG. 12, the decoding device 214 includes the reception unit 140, the serial-to-parallel (S/P) conversion unit 142, the buffer 144, the SOP detecting unit 146, a detection unit 247, the DC balance compensating data adding unit 152, the 8B10B inverse conversion unit 154, the 8B10B error count unit 158, the determination unit 160, the error output unit 162, and the data output unit 164.

When the value of the syndrome is not "0" and the parity check bit is "1", and also when the error occurs in the 8B10B decoding on the data by the 8B10B inverse conversion unit 154, the detection unit 247 detects that there are an odd number of bit errors in the data.

In the second exemplary embodiment, since the 1-bit error correction is not performed on the data, it is detected that there are an odd number of bit errors of 1 bit or more in the data.

It should be apparent that the configuration of the information transmission system described in the exemplary embodiments is only an example, and the configuration thereof may be changed without departing from the gist of the present invention. For example, it has been described that the information transmission system includes the encoding device and the decoding device, but an information transmission system in which devices including both of an encoding unit and a decoding unit are provided and serial transmission is performed between devices may be used. In addition to the 8B10B conversion method, the number of bits may be converted by a 10B12B conversion method in which a difference between the number of "1"s and the number of "0"s is +2/0/−2. In the 10B12B conversion method, when the running disparity is a plus, a code of which a difference between the number of "1"s and the number of "0" is −2 is output, when the running disparity is a minus, a code of which the difference between the number of "1"s and the number of "0"s is +2 is output, and when the polarity of the running disparity is changed and a code of which the difference between the number of "1"s and the number of "0"s is "0" is output, the running disparity is not changed.

The present invention may be provided by a communication unit, and may also be provided while being stored in a recoding medium such as a CDROM.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A decoding device comprising:
   a reception unit that receives data,
      wherein the number of bits of the data is converted and encoded such that a ratio is within a predetermined range, the ratio being between:
         (i) appearance frequency of a first code and
         (ii) appearance frequency of a second code, and
      wherein the data includes an error correcting code that includes:
         (i) redundant bits for calculating an error position of the encoded data, and
         (ii) a parity check bit of the encoded data; and
   a detection unit that detects that there are an odd number of bit errors in the data when one of two situations exists:
   (1) a first situation requiring:
      (i) a value of a syndrome is a first predetermined value, the value of the syndrome corresponding to an error position calculated based on the redundant bits included in the error correcting code, and
      (ii) an error occurs during the decoding of the encoded data, or
   (2) a second situation requiring:
      (i) the value of the syndrome is not the first predetermined value,
      (ii) a value of the parity check bit is a second predetermined value, and
      (iii) an error occurs during the decoding of the encoded data.

2. The decoding device according to claim 1,
   wherein when the value of the syndrome is not the first predetermined value and the value of the parity check bit is not the second predetermined value, the detection unit detects that there are an even number of bit errors in the data.

3. The decoding device according to claim 1,
   wherein when the value of the syndrome is not the first predetermined value, the value of the parity check bit is the second predetermined value, and an error occurs in the decoding on the encoded data on which the error correction using the syndrome is performed, the detection unit detects that there are an odd number of bit errors of 3 bits or more in the data.

4. The decoding device according to claim 2,
   wherein when the value of the syndrome is not the first predetermined value, the value of the parity check bit is the second predetermined value, and an error occurs in the decoding on the encoded data on which the error correction using the syndrome is performed, the detection unit detects that there are an odd number of bit errors of 3 bits or more in the data.

5. An information transmission system comprising:
an encoding device that includes a conversion unit which converts and encodes the number of bits of data to be maintained such that a ratio between appearance frequency of a first code and appearance frequency of a second code is a predetermined range, generates an error correcting code including redundant bits for calculating an error position of the data and the parity check bit of the data, and adds the generated error correcting code to the encoded data, and a transmission unit which transmits the data obtained by the conversion unit; and
the decoding device according to claim 1.

6. A non-transitory computer readable medium storing a program causing a computer to function as the respective units constituting the decoding device according to claim 1.

* * * * *